(12) United States Patent
Han et al.

(10) Patent No.: US 11,485,749 B2
(45) Date of Patent: Nov. 1, 2022

(54) GROUP 4 METAL ELEMENT-CONTAINING COMPOUNDS, METHOD OF PREPARING THE SAME, PRECURSOR COMPOSITIONS INCLUDING THE SAME FOR FORMING A FILM, AND METHOD OF FORMING A FILM USING THE SAME

(71) Applicant: UP CHEMICAL CO., LTD., Pyeongtaek-si (KR)

(72) Inventors: Won Seok Han, Pyeongtaek-si (KR); Wonyong Koh, Daejeon (KR); Myeong-Ho Park, Suwon-si (KR)

(73) Assignee: UP CHEMICAL CO., LTD., Pyeongtaek-si (KR)

( * ) Notice: Subject to any disclaimer, the term of this patent is extended or adjusted under 35 U.S.C. 154(b) by 0 days.

(21) Appl. No.: 16/987,431

(22) Filed: Aug. 7, 2020

(65) Prior Publication Data

US 2020/0361969 A1 Nov. 19, 2020

Related U.S. Application Data

(63) Continuation of application No. PCT/KR2019/001447, filed on Feb. 1, 2019.

(30) Foreign Application Priority Data

Feb. 7, 2018 (KR) .......... 10-2018-0015297
Apr. 6, 2018 (KR) .......... 10-2018-0040184
Jul. 27, 2018 (KR) .......... 10-2018-0087591

(51) Int. Cl.
*C07F 7/28* (2006.01)
*C08F 4/64* (2006.01)
*C08F 4/6592* (2006.01)

(52) U.S. Cl.
CPC .......... *C07F 7/28* (2013.01); *C08F 4/64082* (2013.01); *C08F 4/6592* (2013.01)

(58) Field of Classification Search
CPC .......... C07F 7/28; C07F 7/00; C08F 4/64082; C08F 4/6592
See application file for complete search history.

(56) References Cited

U.S. PATENT DOCUMENTS

| | | | | |
|---|---|---|---|---|
| 6,316,562 B1* | 11/2001 | Munck | .......... | C07F 17/00 526/170 |
| 6,730,756 B1* | 5/2004 | Andell | .......... | C08F 10/02 502/103 |
| 6,890,876 B2* | 5/2005 | McCullough | .......... | C08F 10/00 526/170 |
| 8,288,241 B2* | 10/2012 | Hirota | .......... | H01L 21/02189 438/387 |
| 10,131,680 B1* | 11/2018 | Han | .......... | C07F 7/28 |
| 10,217,629 B2* | 2/2019 | Dussarrat | .......... | H01L 21/02181 |
| 2009/0081385 A1* | 3/2009 | Heys | .......... | C23C 16/45553 427/585 |
| 2009/0203222 A1* | 8/2009 | Dussarrat | .......... | H01L 21/02211 257/E21.24 |
| 2011/0151227 A1* | 6/2011 | Chalker | .......... | C23C 16/45553 428/220 |
| 2011/0165401 A1* | 7/2011 | Chalker | .......... | C23C 16/405 428/220 |
| 2011/0207337 A1* | 8/2011 | Dussarrat | .......... | H01L 21/02159 438/785 |
| 2012/0108062 A1* | 5/2012 | Anthis | .......... | C07F 15/004 438/681 |
| 2013/0337172 A1* | 12/2013 | Lee | .......... | C23C 16/45551 118/719 |
| 2014/0242812 A1* | 8/2014 | Dussarrat | .......... | H01L 21/02271 438/785 |
| 2016/0315163 A1* | 10/2016 | Dussarrat | .......... | H01L 21/02189 |
| 2016/0362790 A1* | 12/2016 | Cameron | .......... | C23C 16/45553 |
| 2017/0018425 A1* | 1/2017 | Lansalot-Matras | .......... | C07F 7/00 |
| 2017/0107623 A1* | 4/2017 | Kim | .......... | C07F 7/00 |
| 2018/0162882 A1* | 6/2018 | Han | .......... | C07F 17/00 |
| 2019/0119418 A1* | 4/2019 | Yang | .......... | C07F 17/00 |

FOREIGN PATENT DOCUMENTS

| | | | |
|---|---|---|---|
| KR | 100852234 B1 | 8/2008 | |
| KR | 1020100072021 A | 6/2010 | |
| KR | 1020100083145 A | 7/2010 | |
| KR | 1020140074162 A | 6/2014 | |
| KR | 101502251 B1 | 3/2015 | |
| KR | 1020160096480 A | 8/2016 | |
| WO | WO-2007141059 A2 * | 12/2007 | .......... C07F 17/00 |

OTHER PUBLICATIONS

CAS Abstract and Indexed Compound, P Heys et al., US 2009/0081385 (2009) (Year: 2009).*
J. Niinistö, 18 Journal of Materials Chemistry, 5243-5247 (2008) (Year: 2008).*
K. Kukli et al., 27 J. Vac. Sci. Technol. B, 226-229 (2009) (Year: 2009).*
International Search Report for PCT/KR2019/001447 dated May 15, 2019, 6 pages.

* cited by examiner

Primary Examiner — Alexander R Pagano
(74) Attorney, Agent, or Firm — Brundidge & Stanger, P.C.

(57) ABSTRACT

The present disclosure provides a novel Group 4 metal element-containing compound, a method of preparing the Group 4 metal element-containing compound, a precursor composition including the Group 4 metal element-containing compound for film deposition, and a method of forming a Group 4 metal element-containing film using the Group 4 metal element-containing compound. The novel Group 4 metal element-containing compound according to embodiments of the present disclosure makes it possible to form a Group 4 metal element-containing film by atomic layer deposition at a higher temperature than conventionally known Group 4 metal element-containing compounds.

8 Claims, 4 Drawing Sheets

GROUP 4 METAL ELEMENT-CONTAINING COMPOUNDS, METHOD OF PREPARING THE SAME, PRECURSOR COMPOSITIONS INCLUDING THE SAME FOR FORMING A FILM, AND METHOD OF FORMING A FILM USING THE SAME

CROSS-REFERENCE TO RELATED APPLICATIONS

This application is a continuation of PCT Application No. PCT/KR2019/001447, filed on Feb. 1, 2019, which claims priority to Korean Patent Application Number 10-2018-0015297, filed on Feb. 7, 2018, Korean Patent Application Number 10-2018-0040184, filed on Apr. 6, 2018, and Korean Patent Application Number 10-2018-0087591, filed on Jul. 27, 2018, all of which are hereby incorporated by reference in their entirety.

TECHNICAL FIELD

The present disclosure relates to a novel Group 4 metal element-containing compound, a method of preparing the Group 4 metal element-containing compound, a precursor composition including the Group 4 metal element-containing compound for forming a film and a method of forming a Group 4 metal element-containing film using the Group 4 metal element-containing compound.

BACKGROUND

A film formed of a compound, e.g., an oxide or nitride, containing a Group 4 metal element such as Ti, Zr, and Hf, e.g., a zirconium oxide film, a titanium nitride film, etc., is used as a high dielectric material, an electrode, etc. to manufacture a semiconductor device. In order to form a film containing a Group 4 metal element 4 by chemical vapor deposition (CVD) or atomic layer deposition (ALD), various Group 4 metal compounds are used. Further, a compound containing a Group 4 metal element is also used as a catalyst for polymer synthesis [Korean Patent No. 10-0852234]. However, there is still a need for the development of a novel Group 4 metal element-containing compound which can be usefully used as a precursor for forming a uniform film, particularly for forming a uniform Group 4 metal element-containing film or thin film on the entire surfaces of a substrate or porous substrate having a trench (groove).

DISCLOSURE OF THE INVENTION

Problems to be Solved by the Invention

The present disclosure is conceived to provide novel Group 4 metal element-containing compound, a method of preparing the Group 4 metal element-containing compound, a precursor composition including the Group 4 metal element-containing compound for film formation and a method of forming a Group 4 metal element-containing film using the Group 4 metal element-containing compound.

However, problems to be solved by the present disclosure are not limited to the above-described problems. Although not described herein, other problems to be solved by the present disclosure can be clearly understood by a person with ordinary skill in the art from the following description.

Means for Solving the Problems

According to a first aspect of the present disclosure, there is provided a Group 4 metal element-containing compound represented by the following Chemical Formula I:

$(R^1C_5H_4)MA_3$; 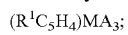 [Chemical Formula I]

wherein in the above Chemical Formula I, M is Ti, Zr or Hf, $R^1$ is a linear or branched alkyl group having 3 to 5 carbon atoms, A is $-NR^2R^3$ or $-OR^4$, each of $R^2$ and $R^3$ is independently methyl or ethyl, and $R^4$ is a linear or branched alkyl group having 1 to 4 carbon atoms.

According to a second aspect of the present disclosure, there is provided a method of preparing the Group 4 metal element-containing compound according to the first aspect of the present disclosure.

According to a third aspect of the present disclosure, there is provided a precursor composition for film formation, including the Group 4 metal element-containing compound according to the first aspect of the present disclosure.

According to a fourth aspect of the present disclosure, there is provided a method of forming a Group 4 metal element-containing film, including forming a Group 4 metal element-containing film using the Group 4 metal element-containing compound according to the first aspect of the present disclosure as a precursor.

Effects of the Invention

A novel Group 4 metal element-containing compound according to embodiments of the present disclosure is a novel compound that has not been known ever before. The novel Group 4 metal element-containing compound according to embodiments of the present disclosure is thermally stable as a liquid at room temperature.

The novel Group 4 metal element-containing compound according to embodiments of the present disclosure has high thermal stability and thus can be used as a precursor for vapor deposition, e.g., atomic layer deposition or chemical vapor deposition, to form a Group 4 metal element-containing film and particularly can be used to uniformly form a Group 4 metal element-containing film having a thickness of several nm to several tens of nm on a substrate or porous substrate having a trench (groove) in its surface. For example, the novel Group 4 metal element-containing compound according to embodiments of the present disclosure has an excellent effect of uniformly forming a Group 4 metal element-containing film having a thickness of several nm to several tens of nm on the entire surfaces of a substrate including a surface of the deepest portion of the fine trench (groove) and an upper surface of the fine trench (groove) having a fine trench (groove) in its surface with an aspect ratio of about 1 or more and a width of about 1 μm or less.

A composition including a Group 4 metal element-containing compound precursor and a method of preparing a Group 4 metal element-containing film using the precursor according to embodiments of the present disclosure can be applied to manufacturing of commercial semiconductor devices. Particularly, in order to manufacture a DRAM semiconductor device, it is necessary to form a high dielectric material to a thickness of several nm on a substrate having a groove with a width of much less than about 100 nm or about 50 nm and an aspect ratio of about 10:1, about 20:1, or about 30:1, or a deeper and narrower groove. Particularly, it is necessary to form a high dielectric material film having a uniform thickness even at a temperature of about 280° C., about 300° C., or more, and thus, a precursor composition with which a film having a uniform thickness can be formed on a very narrow and deep groove by atomic layer deposition (ALD) even at a high temperature is needed and a Ti, Zr, or Hf compound having very high thermal stability is needed to be used as the precursor composition.

Thus, the Group 4 metal element-containing compound according to embodiments of the present disclosure can be usefully used as a precursor that satisfies the above-described requirements.

The Group 4 metal element-containing compound according to embodiments of the present disclosure can be used as a precursor for ALD, CVD, and the like and thus can provide performance, e.g., improved thermal stability, high volatility and/or increased deposition rate, required for manufacturing of next-generation devices such as semiconductors and therefore can be usefully used for forming a Group 4 metal element-containing film or thin film.

Further, the Group 4 metal element-containing compound according to an embodiment of the present disclosure can be applied to various fields such as catalyst and the like.

BEST MODE FOR CARRYING OUT THE INVENTION

Figure 1:
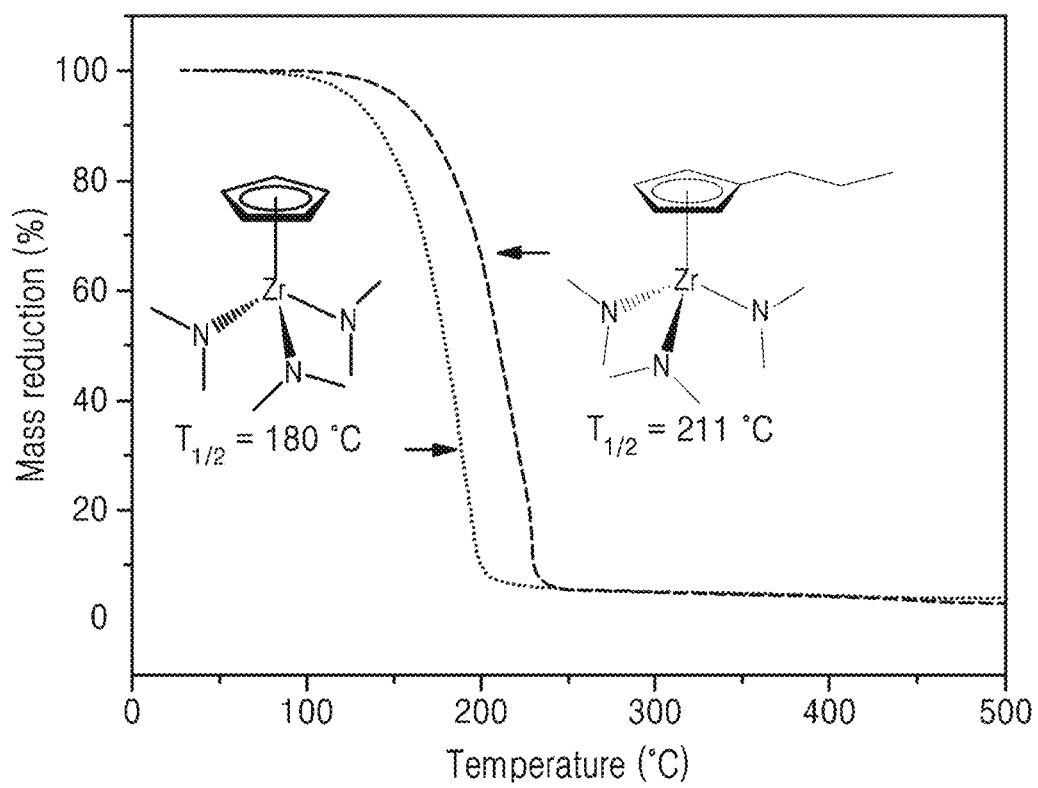
FIG. 1 is a thermogravimetric analysis graph for Compound 1 [$^{n}$PrCpZr(NMe$_2$)$_3$] prepared according an example of the present disclosure and a compound according to a comparative example.

Hereinafter, examples of the present disclosure will be described in detail with reference to the accompanying drawings so that the present disclosure may be readily implemented by a person with ordinary skill in the art. However, it is to be noted that the present disclosure is not limited to the examples but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element.

Through the whole document, the term "on" that is used to designate a position of one element with respect to another element includes both a case that the one element is adjacent to the other element and a case that any other element exists between these two elements.

Further, through the whole document, the term "comprises or includes" and/or "comprising or including" used in the document means that one or more other components, steps, operation and/or existence or addition of elements are not excluded in addition to the described components, steps, operation and/or elements unless context dictates otherwise. Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

Through the whole document, the term "combination(s) of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document, a phrase in the form "A and/or B" means "A or B, or A and B".

Through the whole document, the term "alkyl" includes linear or branched alkyl groups having 1 to 12 carbon atoms, 1 to 10 carbon atoms, 1 to 8 carbon atoms, 1 to 5 carbon atoms, or 1 to 4 carbon atoms and all the possible isomers thereof. For example, the alkyl groups may include a methyl group (Me), an ethyl group (Et), a n-propyl group ($^{n}$Pr), an iso-propyl group ($^{i}$Pr), a n-butyl group ($^{n}$Bu), a tert-butyl group ($^{t}$Bu), an iso-butyl group ($^{i}$Bu), a sec-butyl group ($^{s}$Bu), a neo-pentyl group ($^{neo}$Pe), a hexyl group, an iso-hexyl group, a heptyl group, a 4,4-dimethyl pentyl group, an octyl group, a 2,2,4-trimethyl pentyl group, a nonyl group, a decyl group, an undecyl group, a dodecyl group, and isomers thereof, but may not be limited thereto.

Through the whole document, the term "Group 4 metal element" refers to a chemical element belonging to the fourth group in the Periodic Table and may include Ti, Zr or Hf.

Through the whole document, the term "Cp" is the abbreviation of a "cyclopentadienyl" group.

In the following description, embodiments of the present disclosure will be described in detail, but the present disclosure may not be limited thereto.

According to a first aspect of the present disclosure, there is provided a Group 4 metal element-containing compound represented by the following Chemical Formula 1:

A first aspect of the present disclosure provides a Group 4 metal element-containing compound represented by the following Chemical Formula I:

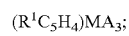  [Chemical Formula I]

wherein in the above Chemical Formula I, M is Ti, Zr or Hf, $R^1$ is a linear or branched alkyl group having 3 to 5 carbon atoms, A is —NR$^2$R$^3$ or —OR$^4$, each of R$^2$ and R$^3$ is independently methyl or ethyl, and R$^4$ is a linear or branched alkyl group having 1 to 4 carbon atoms.

In an embodiment of the present disclosure, the Group 4 metal element-containing compound may be represented by the following Chemical Formula 1, but may not be limited thereto:

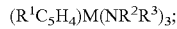   [Chemical Formula 1]

wherein in the above Chemical Formula 1, M is Ti, Zr or Hf, $R^1$ is a linear or branched alkyl group having 3 to 5 carbon atoms, and $R^2$ and $R^3$ are each independently methyl or ethyl.

In an embodiment of the present disclosure, the Group 4 metal element-containing compound may be represented by the following Chemical Formula 2, but may not be limited thereto:

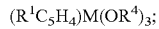   [Chemical Formula 2]

wherein in the above Chemical Formula 2, M is Ti, Zr or Hf, $R^1$ is a linear or branched alkyl group having 3 to 5 carbon atoms, and $R^4$ is a linear or branched alkyl group having 1 to 4 carbon atoms.

In an embodiment of the present disclosure, R may be n-propyl, isopropyl, n-butyl, isobutyl, sec-butyl, tert-butyl, n-pentyl, isopentyl, or neopentyl, but may not be limited thereto.

In an embodiment of the present disclosure, $R^4$ may be methyl, ethyl, n-propyl, isopropyl, n-butyl, isobutyl, sec-butyl, ortert-butyl, but may not be limited thereto. In an embodiment of the present disclosure, examples of the Group 4 metal element-containing compound represented by the above Chemical Formula I may include the following Ti, Zr, or Hf compounds, but may not be limited thereto:
(n-propylcyclopentadienyl)tris(dimethylamido)zirconium [$^n$PrCpZr(NMe$_2$)$_3$];
(n-propylcyclopentadienyl)tris(ethylmethylamido)zirconium [$^n$PrCpZr(NEtMe)$_3$];
(n-propylcyclopentadienyl)tris(diethylamido)zirconium [$^n$PrCpZr(NEt$_2$)$_3$];
(n-butylcyclopentadienyl)tris(dimethylamido)zirconium [$^n$BuCpZr(NMe$_2$)$_3$];
(n-butylcyclopentadienyl)tris(ethylmethylamido)zirconium [$^n$BuCpZr(NEtMe)$_3$];
(n-butylcyclopentadienyl)tris(diethylamido)zirconium [$^n$BuCpZr(NEt$_2$)$_3$];
(isobutylcyclopentadienyl)tris(dimethylamido)zirconium [$^{iso}$BuCpZr(NMe$_2$)$_3$];
(isobutylcyclopentadienyl)tris(ethylmethylamido)zirconium [$^{iso}$BuCpZr(NEtMe)$_3$];
(isobutylcyclopentadienyl)tris(diethylamido)zirconium [$^{iso}$BuCpZr(NEt$_2$)$_3$];
(sec-butylcyclopentadienyl)tris(dimethylamido)zirconium [$^{sec}$BuCpZr(NMe$_2$)$_3$];
(sec-butylcyclopentadienyl)tris(ethylmethylamido)zirconium [$^{sec}$BuCpZr(NEtMe)$_3$];
(sec-butylcyclopentadienyl)tris(diethylamido)zirconium [$^{sec}$BuCpZr(NEt$_2$)$_3$];
(neopentylcyclopentadienyl)tris(dimethylamido)zirconium [$^{neo}$PeCpZr(NMe$_2$)$_3$];
(neopentylcyclopentadienyl)tris(ethylmethylamido)zirconium [$^{neo}$PeCpZr(NEtMe)$_3$];
(neopentylcyclopentadienyl)tris(diethylamido)zirconium [$^{neo}$PeCpZr(NEt$_2$)$_3$];
(n-propylcyclopentadienyl)tris(dimethylamido)hafnium [$^n$PrCpHf(NMe$_2$)$_3$];
(n-propylcyclopentadienyl)tris(ethylmethylamido)hafnium [$^n$PrCpHf(NEtMe)$_3$];
(n-propylcyclopentadienyl)tris(diethylamido)hafnium [$^n$PrCpHf(NEt$_2$)$_3$];
(n-butylcyclopentadienyl)tris(dimethylamido)hafnium [$^n$BuCpHf(NMe$_2$)$_3$];
(n-butylcyclopentadienyl)tris(ethylmethylamido)hafnium [$^n$BuCpHf(NEtMe)$_3$];
(n-butylcyclopentadienyl)tris(diethylamido)hafnium [$^n$BuCpHf(NEt$_2$)$_3$];
(isobutylcyclopentadienyl)tris(dimethylamido)hafnium [$^n$BuCpHf(NMe$_2$)$_3$];
(isobutylcyclopentadienyl)tris(ethylmethylamido)hafnium [$^n$BuCpHf(NEtMe)$_3$];
(isobutylcyclopentadienyl)tris(diethylamido)hafnium [$^{iso}$BuCpHf(NEt$_2$)$_3$];
(sec-butylcyclopentadienyl)tris(dimethylamido)hafnium [$^{sec}$BuCpHf(NMe$_2$)$_3$];
(sec-butylcyclopentadienyl)tris(ethylmethylamido)hafnium [$^{sec}$BuCpHf(NEtMe)$_3$];
(sec-butylcyclopentadienyl)tris(diethylamido)hafnium [$^{sec}$BuCpHf(NEt$_2$)$_3$];
(neopentylcyclopentadienyl)tris(dimethylamido)hafnium [$^{neo}$PeCpHf(NMe$_2$)$_3$];
(neopentylcyclopentadienyl)tris(ethylmethylamido)hafnium [$^{neo}$PeCpHf(NEtMe)$_3$];
(neopentylcyclopentadienyl)tris(diethylamido)hafnium [$^{neo}$PeCpHf(NEt$_2$)$_3$];
(n-propylcyclopentadienyl)tris(dimethylamido)titanium [$^n$PrCpTi(NMe$_2$)$_3$];
(n-propylcyclopentadienyl)tris(ethylmethylamido)titanium [$^n$PrCpTi(NEtMe)$_3$];
(n-propylcyclopentadienyl)tris(diethylamido)titanium [$^n$PrCpTi(NEt$_2$)$_3$];
(n-butylcyclopentadienyl)tris(dimethylamido)titanium [$^n$BuCpTi(NMe$_2$)$_3$];
(n-butylcyclopentadienyl)tris(ethylmethylamido)titanium [$^n$BuCpTi(NEtMe)$_3$];
(n-butylcyclopentadienyl)tris(diethylamido)titanium [$^n$BuCpTi(NEt$_2$)$_3$];
(isobutylcyclopentadienyl)tris(dimethylamido)titanium [$^{iso}$BuCpTi(NMe$_2$)$_3$];
(isobutylcyclopentadienyl)tris(ethylmethylamido)titanium [$^{iso}$BuCpTi(NEtMe)$_3$];
(isobutylcyclopentadienyl)tris(diethylamido)titanium [$^{iso}$BuCpTi(NEt$_2$)$_3$];
(sec-butylcyclopentadienyl)tris(dimethylamido)titanium [$^{sec}$BuCpTi(NMe$_2$)$_3$];
(sec-butylcyclopentadienyl)tris(ethylmethylamido)titanium [$^{sec}$BuCpTi(NEtMe)$_3$];
(sec-butylcyclopentadienyl)tris(diethylamido)titanium [$^{sec}$BuCpTi(NEt$_2$)$_3$];
(neopentylcyclopentadienyl)tris(dimethylamido)titanium [$^{neo}$PeCpTi(NMe$_2$)$_3$];
(neopentylcyclopentadienyl)tris(ethylmethylamido)titanium [$^{neo}$PeCpTi(NEtMe)$_3$];
(neopentylcyclopentadienyl)tris(diethylamido)titanium [$^{neo}$PeCpTi(NEt$_2$)$_3$];
(n-propylcyclopentadienyl)trimethoxyzirconium [$^n$PrCpZr(OMe)$_3$];
(n-propylcyclopentadienyl)triethoxyzirconium [$^n$PrCpZr(OEt)$_3$];
(n-propylcyclopentadienyl)triisopropoxyzirconium [$^n$PrCpZr(O$^i$Pr)$_3$];
(n-butylcyclopentadienyl)trimethoxyzirconium [$^n$BuCpZr(OMe)$_3$];
(n-butylcyclopentadienyl)triethoxyzirconium [$^n$BuCpZr(OEt)$_3$];
(n-butylcyclopentadienyl)triisopropoxyzirconium [$^n$BuCpZr(O$^i$Pr)$_3$];

(isobutylcyclopentadienyl)trimethoxyzirconium [$^{iso}$BuCpZr(OMe)$_3$];
(isobutylcyclopentadienyl)triethoxyzirconium [$^{iso}$BuCpZr(OEt)$_3$];
(isobutylcyclopentadienyl)triisopropoxyzirconium [$^{iso}$BuCpZr(O$^i$Pr)$_3$];
(sec-butylcyclopentadienyl)trimethoxyzirconium [$^{sec}$BuCpZr(OMe)$_3$];
(sec-butylcyclopentadienyl)triethoxyzirconium [$^{sec}$BuCpZr(OEt)$_3$];
(sec-butylcyclopentadienyl)triisopropoxyzirconium [$^{sec}$BuCpZr(O$^i$Pr)$_3$];
(neopentylcyclopentadienyl)trimethoxyzirconium [$^{neo}$PeCpZr(OMe)$_3$];
(neopentyl cyclopentadienyl)triethoxyzirconium [$^{neo}$PeCpZr(OEt)$_3$];
(neopentylcyclopentadienyl)triisopropoxyzirconium [$^{neo}$PeCpZr(O$^i$Pr)$_3$];
(n-propylcyclopentadienyl)trimethoxyhafnium [$^n$PrCpHf(OMe)$_3$];
(n-propylcyclopentadienyl)triethoxyhafnium [$^n$PrCpHf(OEt)$_3$];
(n-propylcyclopentadienyl)triisopropoxyhafnium [$^n$PrCpHf(O$^i$Pr)$_3$];
(n-butylcyclopentadienyl)trimethoxyhafnium [$^n$BuCpHf(OMe)$_3$];
(n-butylcyclopentadienyl)triethoxyhafnium [$^n$BuCpHf(OEt)$_3$];
(n-butylcyclopentadienyl)triisopropoxyhafnium [$^n$BuCpHf(O$^i$Pr)$_3$];
(isobutylcyclopentadienyl)trimethoxyhafnium [$^{iso}$BuCpHf(OMe)$_3$];
(isobutylcyclopentadienyl)triethoxyhafnium [$^{iso}$BuCpHf(OEt)$_3$];
(isobutylcyclopentadienyl)triisopropoxyhafnium [$^{iso}$BuCpHf(O$^i$Pr)$_3$];
(sec-butylcyclopentadienyl)trimethoxyhafnium [$^{sec}$BuCpHf(OMe)$_3$];
(sec-butylcyclopentadienyl)triethoxyhafnium [$^{sec}$BuCpHf(OEt)$_3$];
(sec-butylcyclopentadienyl)triisopropoxyhafnium [$^{sec}$BuCpHf(O$^i$Pr)$_3$];
(neopentylcyclopentadienyl)trimethoxyhafnium [$^{neo}$PeCpHf(OMe)$_3$];
(neopentyl cyclopentadienyl)triethoxyhafnium [$^{neo}$PeCpHf(OEt)$_3$];
(neopentylcyclopentadienyl)triisopropoxyhafnium [$^{neo}$PeCpHf(O$^i$Pr)$_3$];
(n-propylcyclopentadienyl)trimethoxytitanium [$^n$PrCpTi(OMe)$_3$];
(n-propylcyclopentadienyl)triethoxytitanium [$^n$PrCpTi(OEt)$_3$];
(n-propylcyclopentadienyl)triisopropoxytitanium [$^n$PrCpTi(O$^i$Pr)$_3$];
(n-butylcyclopentadienyl)trimethoxytitanium [$^n$BuCpTi(OMe)$_3$];
(n-butylcyclopentadienyl)triethoxytitanium [$^n$BuCpTi(OEt)$_3$];
(n-butylcyclopentadienyl)triisopropoxytitanium [$^n$BuCpTi(O$^i$Pr)$_3$];
(isobutylcyclopentadienyl)trimethoxytitanium [$^{iso}$BuCpTi(OMe)$_3$];
(isobutylcyclopentadienyl)triethoxytitanium [$^{iso}$BuCpTi(OEt)$_3$];
(isobutylcyclopentadienyl)triisopropoxytitanium [$^{iso}$BuCpTi(O$^i$Pr)$_3$];
(sec-butylcyclopentadienyl)trimethoxytitanium [$^{sec}$BuCpTi(OMe)$_3$];
(sec-butylcyclopentadienyl)triethoxytitanium [$^{sec}$BuCpTi(OEt)$_3$];
(sec-butylcyclopentadienyl)triisopropoxytitanium [$^{sec}$BuCpTi(O$^i$Pr)$_3$];
(neopentylcyclopentadienyl)trimethoxytitanium [$^{neo}$PeCpTi(OMe)$_3$];
(neopentyl cyclopentadienyl)triethoxytitanium [$^{neo}$PeCpTi(OEt)$_3$]; and
(neopentylcyclopentadienyl)triisopropoxytitanium [$^{neo}$PeCpTi(O$^i$Pr)$_3$].

In an embodiment of the present disclosure, the Group 4 metal element-containing compound is liquid and stable at room temperature.

A second aspect of the present disclosure provides a method of preparing the Group 4 metal element-containing compound according to the first aspect of the present disclosure.

In an embodiment of the present disclosure, the preparation method may include reacting a compound represented by the following Chemical Formal 3 with a compound represented by the following Chemical Formula 4 to obtain the Group 4 metal element-containing compound represented by the above Chemical Formula 1:

| | |
|---|---|
| $R^1C_5H_4$; | [Chemical Formula 3] |
| $M(NR^2R^3)_3$; | [Chemical Formula 4] |
| $(R^1C_5H_4)M(NR^2R^3)_3$; | [Chemical Formula 1] | wherein in each of the above Chemical Formulas 3, 4 and 1, $R^1$ is a linear or branched alkyl group having 3 to 5 carbon atoms, M is Ti, Zr or Hf, and each of $R^2$ and $R^3$ is each independently methyl or ethyl.

In another embodiment of the present disclosure, the preparation method may include reacting a Group 4 metal element-containing compound represented by the following Chemical Formal 1 obtained in the above-described embodiment with a compound represented by the following Chemical Formula 5 to obtain a Group 4 metal element-containing compound represented by the following Chemical Formula 2 by:

| | |
|---|---|
| $(R^1C_5H_4)M(NR^2R^3)_3$; | [Chemical Formula 1] |
| $R^4OH$; | [Chemical Formula 5] |
| $(R^1C_5H_4)M(OR^4)_3$; | [Chemical Formula 2] | wherein in each of the above Chemical Formulas 1, 5 and 2, M is Ti, Zr or Hf, $R^1$ is a linear or branched alkyl group having 3 to 5 carbon atoms, each of $R^2$ and $R^3$ is independently methyl or ethyl, and $R^4$ is a linear or branched alkyl group having 1 to 4 carbon atoms.

In embodiments of the present disclosure, the reacting the compound represented by the above Chemical Formula 3 with the compound represented by the above Chemical Formula 4 or the reacting the compound represented by the above Chemical Formula 1 with the compound represented by the above Chemical Formula 5 may be carried out in an organic solvent. The organic solvent may be selected from non-polar organic solvents known in the art without specific limitation. For example, the organic solvent may include non-polar organic solvents such as n-hexane, benzene, toluene, and the like, but may not be limited thereto.

In embodiments of the present disclosure, the reacting the compound represented by the above Chemical Formula 3 with the compound represented by the above Chemical Formula 4 or the reacting the compound represented by the above Chemical Formula 1 with the compound represented by the above Chemical Formula 5 may be carried out at room temperature.

In an embodiment of the present disclosure, the compound represented by the above Chemical Formula 3 is mixed with an organic solvent and the compound represented by the above Chemical Formula 4 is slowly dropwise added thereto to make a reaction at room temperature (for 1 hour or more, 3 hours or less, or 5 hours or less). Then, the solvent is removed under depressurized conditions, followed by vacuum distillation. Thus, it is possible to obtain a Group 4 metal element-containing compound represented by the above Chemical Formula 1 which is liquid at room temperature.

In an embodiment of the present disclosure, the compound represented by the above Chemical Formula 1 is mixed with an organic solvent and the compound represented by the above Chemical Formula 5 is slowly dropwise added thereto to make a reaction at room temperature (for 1 hour or more, 3 hours or less, or 5 hours or less). Then, the solvent is removed under depressurized conditions, followed by vacuum distillation. Thus, it is possible to obtain a Group 4 metal element-containing compound represented by the above Chemical Formula 2 which is liquid at room temperature.

All the descriptions of the first aspect of the present disclosure may be applied to the second aspect of the present disclosure.

A third aspect of the present disclosure provides a precursor composition for forming a film, including the Group 4 metal element-containing compound according to the first aspect of the present disclosure.

In an embodiment of the present disclosure, the precursor composition for forming a film may be used for deposition of a Group 4 metal element-containing film or thin film. The Group 4 metal element-containing film or thin film may have a thickness of from about 1 nm to several $\mu$m, but may not be limited thereto.

In an embodiment of the present disclosure, the Group 4 metal element-containing film may include a Group 4 metal element-containing oxide film, nitride film, oxynitride film, carbide film or carbonitride film, but may not be limited thereto.

In an embodiment of the present disclosure, the Group 4 metal element-containing film may contain the at least two Group 4 metal elements or may contain the at least one Group 4 metal elements together with one or more of other additional metal elements. The additional metal elements may include those known in the art without specific limitation, and may include, for example, magnesium (Mg), calcium (Ca), zinc (Zn), boron (B), aluminum (Al), indium (In), silicon (Si), germanium (Ge), tin (Sn), hafnium (Hf), zirconium (Zr), titanium (Ti), vanadium (V), niobium (Nb), tantalum (Ta); and at least one metals selected from the group consisting of lanthanum-based elements, more particularly, scandium (Sc), yttrium (Y) and lanthanum (La), and rare earth metal elements, but may not be limited thereto.

In an embodiment of the present disclosure, the Group 4 metal element-containing film may be formed by vapor deposition. For example, the vapor deposition may include at least one selected from the group consisting of chemical vapor deposition, low pressure chemical vapor deposition, plasma enhanced chemical vapor deposition, cyclic chemical vapor deposition, plasma enhanced cyclic chemical vapor deposition, atomic layer deposition, and plasma enhanced atomic layer deposition, but may not be limited thereto.

All the descriptions of the first aspect of the present disclosure may be applied to the third aspect of the present disclosure.

A fourth aspect of the present disclosure provides a method of forming a Group 4 metal element-containing film or thin film, including forming a Group 4 metal element-containing film or thin film using the Group 4 metal element-containing compound according to the first aspect of the present disclosure as a precursor. The Group 4 metal element-containing film may contain the at least two Group 4 metal elements or may contain the at least one Group 4 metal elements together with at least one other additional metal elements.

In an embodiment of the present disclosure, the method of forming a Group 4 metal element-containing film or thin film may include supplying and depositing the precursor composition for forming a Group 4 metal element-containing film or thin film on a substrate positioned within a deposition chamber to form a Group 4 metal element-containing film or thin film by, but may not be limited thereto. The method of forming a film may employ a method or apparatus, etc. known in the art and may be performed using at least one additional reaction gases together if necessary. The substrate may employ a silicon semiconductor wafer or a compound semiconductor wafer, but may not be limited thereto. A substrate having a hole or trench (groove) may be used, and for example, a porous substrate having a large surface area may be used as a catalyst.

In an embodiment of the present disclosure, the Group 4 metal element-containing film may be formed by vapor deposition. For example, the vapor deposition may include at least one selected from the group consisting of chemical vapor deposition (CVD), low pressure chemical vapor deposition (LPCVD), plasma enhanced chemical vapor deposition (PECVD), cyclic chemical vapor deposition (cyclic CVD), plasma enhanced cyclic chemical vapor deposition (PE cyclic CVD), atomic layer deposition (ALD), and plasma enhanced atomic layer deposition (PEALD), but may not be limited thereto.

In an embodiment of the present disclosure, the method of forming a Group 4 metal element-containing film or thin film may include the following processes, but may not be limited thereto: providing at least one surfaces of the substrate in a reaction chamber; introducing a precursor containing the Group 4 metal element-containing compound into the reaction chamber; and introducing a reaction gas into the reaction chamber, and herein, a Group 4 metal element-containing film is formed on the at least one surfaces of the substrate by vapor deposition.

In an embodiment of the present disclosure, the Group 4 metal element-containing film may include a Group 4 metal element-containing oxide film, nitride film, oxynitride film, carbide film or carbonitride film, but may not be limited thereto.

In an embodiment of the present disclosure, the Group 4 metal element-containing film may contain the at least two Group 4 metal elements or may contain the at least one Group 4 metal elements together with at least one other additional metal elements. A film containing the Group 4 metal element and another additional metal element may be formed by simultaneously or sequentially supplying at least one additional precursors containing a metal element that is identical to or different from that of a first precursor containing the Group 4 metal element-containing compound and at least one additional precursors containing the Group 4 metal element-containing compound in the method of forming a Group 4 metal element-containing film or thin film, but may not be limited thereto. If the precursors are supplied sequentially, the reaction gas and/or purge gas may be supplied between the supplies of the precursors, but may not be limited thereto. A deposition process known in the art may be appropriately selected and used by a person with ordinary skill in the art.

The additional metal elements may include those known in the art without specific limitation, and may include, for example, magnesium (Mg), calcium (Ca), zinc (Zn), boron (B), aluminum (Al), indium (In), silicon (Si), germanium (Ge), tin (Sn), hafnium (Hf), zirconium (Zr), titanium (Ti), vanadium (V), niobium (Nb), tantalum (Ta); and one or more metals selected from the group consisting of lanthanum-based elements, more particularly, scandium (Sc), yttrium (Y) and lanthanum (La), and rare earth metal elements, but may not be limited thereto. A precursor containing the additional metal element may employ one of those known in the art without specific limitation.

In an embodiment of the present disclosure, the reaction gas may include at least one selected from the group consisting of an oxygen-containing source, a nitrogen-containing source, a carbon-containing source, and a reducing agent, but may not be limited thereto.

In an embodiment of the present disclosure, the nitrogen-containing source may be selected from the group consisting of nitrogen ($N_2$), nitrogen-containing radical, ammonia, hydrazine, monoalkylhydrazine, dialkylhydrazine, nitrogen/hydrogen, ammonia plasma, nitrogen plasma, nitrogen/hydrogen plasma, and mixtures thereof, but may not be limited thereto.

In a specific example, the nitrogen-containing source includes an ammonia plasma or hydrogen/nitrogen plasma source gas supplied into a reactor at a flow rate of from about 1 square cubic centimeter (sccm) to about 2,000 sccm or from about 1 sccm to about 1,000 sccm. The nitrogen-containing source may be supplied for a period of time from about 0.1 second to about 100 seconds. In a specific example in which a film is deposited by ALD or cyclic CVD, a precursor pulse may have a pulse duration of more than about 0.01 second, the nitrogen-containing source may have a pulse duration of more than about 0.01 second and a water pulse may have a pulse duration of more than about 0.01 second. In another specific example, a purge duration between the pulses may be as low as 0 seconds or may be continuously pulsed without a purge in-between.

In an embodiment of the present disclosure, the oxygen-containing source may be introduced into the reactor in the form of at least one oxygen-containing sources or may be present subsidiary to other precursors used for deposition. A suitable oxygen-containing source may include, for example, water ($H_2O$) (e.g., deionized water, purified water and/or distilled water), $H_2O_2$, oxygen ($O_2$), oxygen-containing radical, oxygen plasma, ozone ($O_3$), NO, $N_2O$, $NO_2$, carbon monoxide (CO), carbon dioxide ($CO_2$), and combinations thereof. In a specific example, the oxygen-containing source includes an oxygen-containing source gas supplied into the reactor at a flow rate of from about 1 sccm to about 2,000 sccm or from about 1 sccm to about 1,000 sccm. The oxygen-containing source may be supplied for a period of time from about 0.1 second to about 100 seconds. In a specific example, the oxygen-containing source includes water having a temperature of 10° C. or more. In a specific example in which a film is deposited by ALD or cyclic CVD, a precursor pulse may have a pulse duration of more than about 0.01 second, the oxygen-containing source may have a pulse duration of more than about 0.01 second and a water pulse may have a pulse duration of more than about 0.01 second, but may not be limited thereto.

In an embodiment of the present disclosure, a reactive species may be selected from all of nitrogen and oxygen sources, more particularly, NO, $NO_2$, $N_2O$, $N_2O_5$, $N_2O_4$, and mixtures thereof, but may not be limited thereto.

The reactive species used for the above-described method may include oxygen sources, mixtures of oxygen sources, mixtures of nitrogen sources, all of oxygen and nitrogen sources, or mixtures thereof depending on the N/O ratio if necessary, but may not be limited thereto. In an embodiment of the present disclosure, If the Group 4 metal element-containing film contains carbon like a carbide film or a carbonitride film, one or more kinds of carbon sources may be used. For example, methane, ethane, propane, butane, ethylene, propylene, t-butylene, or the like may be used, but the present disclosure may not be limited thereto.

In an embodiment of the present disclosure, the reducing agent may include a member selected from the group consisting of hydrogen, hydrogen plasma and hydrogen chloride, but may not be limited thereto.

The deposition method described herein may include one or more purge gases. A purge gas that is used for purging unconsumed reactants and/or by-products is an inert gas that does not react with a precursor. Examples of the purge gas may include argon (Ar), nitrogen ($N_2$), helium (He), neon, hydrogen ($H_2$), and mixtures thereof, but may not be limited thereto. In a specific example, a purge gas, e.g., Ar is supplied into the reactor at a flow rate of from 10 sccm to about 2,000 sccm for a period of time from about 0.1 second to about 100 seconds, and thus, unreacted materials and any by-products that may remain in the reactor can be purged.

The respective processes of supplying the precursors, the oxygen-containing source, the nitrogen-containing source and/or other precursors, source gases, and/or reagents may be performed by changing the time for supplying them in order to change the stoichiometric composition of the resulting Group 4 metal element-containing film.

Energy is applied to the at least one precursors, the nitrogen-containing source, the reducing agent, other precursors or combinations thereof in order to induce the above-described reaction and form a Group 4 metal element-containing film or coating on the substrate. The energy can be supplied by thermal, plasma, pulsed plasma, helicon plasma, high-density plasma, inductively coupled plasma, X-ray, e-beam, photon, remote plasma methods, and combinations thereof, but may not be limited thereto. In a specific example, a secondary RF frequency source can be used to modify the plasma characteristics at the substrate surface. In a specific example in which the deposition involves plasma, a plasma-generated process may include a direct plasma-generated process in which plasma is directly generated in the reactor, or alternatively a remote plasma-generated process in which plasma is generated outside the reactor and supplied into the reactor.

In an embodiment of the present disclosure, a temperature of the substrate may be about 100° C. or more, about 150° C. or more, about 200° C. or more, about 250° C. or more, about 280° C. or more, about 300° C. or more, or about 350° C. or more, but may not be limited thereto. For example, the substrate may have a temperature of from room temperature to about 500° C., from about 100° C. to about 500° C., from about 150° C. to about 500° C., from about 200° C. to about 500° C., from about 250° C. to about 500° C., from about 280° C. to about 500° C., from about 300° C. to about 500° C., or from about 350° C. to about 500° C., but may not be limited thereto.

In an embodiment of the present disclosure, the Group 4 metal element-containing film having a uniform thickness may be formed using a precursor containing the Group 4 metal element-containing compound at a temperature of about 280° C., about 300° C. or more. The Group 4 metal element-containing film may be usefully used as a high dielectric material film.

In an embodiment of the present disclosure, a Group 4 metal element-containing film may be deposited on at least a part of the substrate. Examples of the suitable substrate may include silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, anti-reflective coating, photoresists, flexible substrates, organic polymers, porous organic and inorganic materials, metals such as copper and aluminum, and diffusion barrier layers, such as (but not limited to) TiN, Ti(C)N, TaN, Ta(C)N, Ta, W or WN, but may not be limited thereto. The film is compatible with various follow-up processes, e.g., chemical mechanical planarization (CMP) and anisotropic etching process.

In an embodiment of the present disclosure, the Group 4 metal element-containing film or thin film may have a thickness of from about 1 nm to several μm, but may not be limited thereto.

In an embodiment of the present disclosure, the Group 4 metal element-containing film or thin film may be used as a high dielectric film of a semiconductor device, a chemical reaction catalyst, or the like, but may not be limited thereto.

All the descriptions of the first aspect of the present disclosure may be applied to the fourth aspect of the present disclosure.

In an embodiment of the present disclosure, depositing the film may include performing by metal organic chemical vapor deposition (MOCVD) or atomic layer deposition (ALD), but may not be limited thereto. The metal organic chemical vapor deposition (MOCVD) or atomic layer deposition (ALD) may be performed using a deposition apparatus, deposition conditions, and additional reaction gases known in the art.

The Group 4 metal element-containing compound used as a precursor has high thermal stability, and thus, can be used as a precursor for atomic layer deposition or chemical vapor deposition to form a Group 4 metal element-containing film and particularly can be used to uniformly form a Group 4 metal element-containing film having a thickness of several nm to several tens of nm on a substrate having a trench (groove) in its surface or a porous substrate. For example, the Group 4 metal element-containing compound precursor has an excellent effect of uniformly forming a Group 4 metal element-containing film having a thickness of several nm to several tens of nm on the entire surfaces of a substrate including a surface of the deepest portion of the fine trench (groove) and an upper surface of the fine trench/corrugation (groove) having a fine trench (groove) in its surface with an aspect ratio of about 1 or more, about 2 or more, about 5 or more, about 10 or more, about 20 or more, about 30 or more or about 40 or more and a width of about 1 μm or less, about 500 nm or less, about 400 nm or less, about 300 nm or less, about 200 nm or less, about 100 nm or less, about 80 nm or less, about 60 nm or less, about 50 nm or less, about 40 nm or less, about 30 nm or less, about 20 nm or less or about 10 nm or less.

MODE FOR CARRYING OUT THE INVENTION

Hereinafter, the present disclosure will be explained in more detail with reference to Examples. However, the following Examples are illustrative only for better understanding of the present disclosure but do not limit the present disclosure.

EXAMPLES

<Example 1> Preparation of Compound 1 ["PrCpZr(NMe$_2$)$_3$]

After 91.3 g (0.341 mol) of tetrakis(dimethylamino)zirconium [Zr(N(CH$_3$)$_2$)$_4$] and 400 ml of n-hexane were put into a flame-dried 1 L Schlenk flask, the room temperature was maintained. After 37 g (0.341 mol) of n-propyl cyclopentadiene was slowly dropwise added into the flask, the reaction solution was stirred for 3 hours at room temperature.

After the reaction was completed, the solvent was removed under depressurized conditions, followed by distillation under depressurized conditions to obtain 79 g (yield of 70%) Compound 1 as a pale yellow liquid.

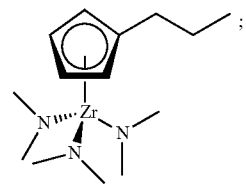

<Compound 1>

Boiling point (bp): 100° C. (0.4 torr);
Elemental analysis: calcd for —(C$_{14}$H$_{29}$N$_3$Zr): C, 50.86, H, 8.84, N, 12.71; found C, 50.76, H, 8.81, N, 12.79;
1H-NMR (400 MHz, C$_6$D$_6$, 25° C.): δ 6.013, 5.923 (m, 4H, C$_5$$\underline{H}_4$—CH$_2$CH$_2$CH$_3$), δ 2.958 (s, 18H, N(C$\underline{H}_3$)$_2$), δ 2.469 (t, 2H, C$_5$H$_4$—C$\underline{H}_2$CH$_2$CH$_3$), δ 1.576 (m, 2H, C$_5$H$_4$—CH$_2$C$\underline{H}_2$CH$_3$), δ 0.920 (t, 3H, C$_5$H$_4$—CH$_2$CH$_2$C$\underline{H}_3$).

A thermogravimetric analysis result for each of Compound 1 prepared according to the present Example and CpZr[N(CH$_3$)$_2$]$_3$ according to Comparative Example is as shown in FIG. 1. The residue amount was about 3% according to the thermogravimetric analysis shown in FIG. 1, which shows that the liquid zirconium compound according to the present Example is very advantageous to be used as a precursor for forming a film (thin film).

<Example 2> Preparation of Compound 2 ["BuCpZr(NMe$_2$)$_3$]

After 109 g (0.407 mol) of tetrakis(dimethylamino)zirconium (VI) and 400 ml of n-hexane (C$_6$H$_{14}$) were put into a flame-dried 1 L Schlenk flask, the room temperature was maintained. After 52 g (0.428 mol) of n-butyl cyclopentadiene was slowly dropwise added into the flask, the reaction solution was stirred for 3 hours at room temperature.

After the reaction was completed, the solvent was removed under depressurized conditions, followed by distillation under depressurized conditions to obtain 98 g (yield of 70%) Compound 2 as a pale yellow liquid.

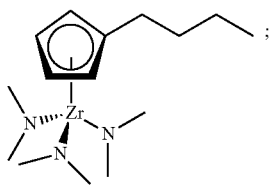

<Compound 2>

Boiling point (bp): 110° C. (0.3 torr);

Elemental analysis: calcd for —($C_{15}H_{31}N_3Zr$): C, 52.27, H, 9.07, N, 12.19; found C, 52.28, H, 9.05, N, 12.17;

1H-NMR (400 MHz, $C_6D_6$, 25° C.): δ 6.015, 5.935 (m, 4H, $C_5\underline{H}_4$—$CH_2CH_2CH_2CH_3$), δ 2.962 (s, 18H, N(C$\underline{H}_3$)$_2$), δ 2.514 (t, 2H, $C_5H_4$—C$\underline{H}_2$$CH_2CH_2CH_3$), δ 1.524 (m, 2H, $C_5H_4$—$CH_2$C$\underline{H}_2$$CH_2CH_3$), δ 1.314 (m, 2H, $C_5H_4$—$CH_2CH_2$C$\underline{H}_2$$CH_3$), δ 0.908 (t, 3H, $C_5H_4$—$CH_2CH_2CH_2$C$\underline{H}_3$).

Figure 2:
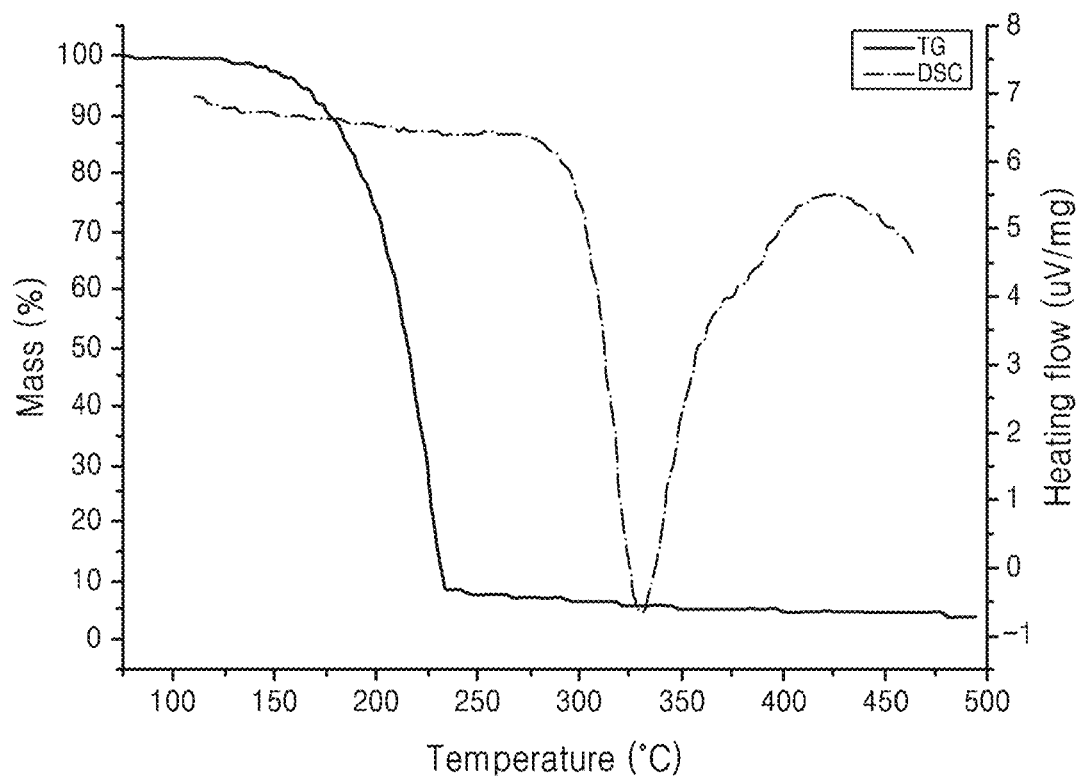
FIG. 2 is a thermogravimetric analysis graph and a differential scanning calorimetry (DSC) analysis graph for Compound 2 [$^{n}$BuCpZr(NMe$_2$)$_3$] prepared according to an example of the present disclosure.

A thermogravimetric analysis result and a differential scanning calorimetry (DSC) analysis result for Compound 2 prepared according to the present Example are as shown in FIG. 2.

Figure 3:
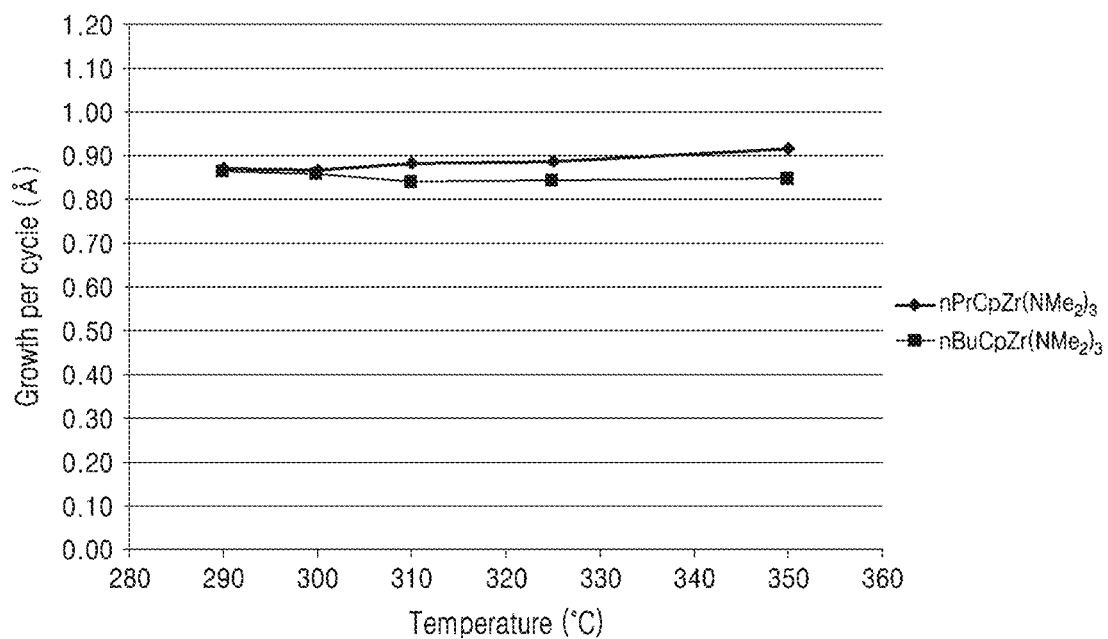
FIG. 3 shows the film growth by atomic layer deposition using Compound 1 [$^{n}$PrCpZr(NMe$_2$)$_3$] and Compound 2 [$^{n}$BuCpZr(NMe$_2$)$_3$] prepared according to an example of the present disclosure, depending on the substrate temperature.

<Example 3> Formation of Zirconium Oxide Film by Atomic Layer Deposition Using Compound 1 and Ozone ($O_3$) Gas A test for forming a zirconium oxide film on a silicon substrate by atomic layer deposition (ALD) using Compound 1 ["PrCpZr(NMe$_2$)$_3$] prepared according to Example 1 as a precursor was conducted. An ALD reactor in which a supplied gas flows laterally with respect to the surface of a substrate without using a shower head was used. The substrate (silicon) was heated at 290° C. to 350° C. Further, a precursor compound put in a stainless-steel container was heated at a temperature of 110° C., and the precursor compound was supplied into the ALD reactor for performing atomic layer deposition by allowing an argon (Ar) gas to pass through the container at a flow velocity of 60 sccm. An internal pressure in the ALD reactor was maintained at 3 torr. An ALD source material supply cycle in which after a gas of the precursor compound was supplied into the ALD reactor for 5 seconds, an argon gas was supplied for 5 seconds and then, an ozone ($O_3$) gas was supplied for 5 seconds and an argon gas was supplied again for 5 seconds was repeated 200 times. The film growth per source material supply cycle of the zirconium oxide thin film formed according to the above-described process was as shown in FIG. 3. As shown in FIG. 3, it can be seen that the film growth per ALD source material supply cycle was uniform at a substrate temperature in the range of from 290° C. to 350° C.

Figure 4:
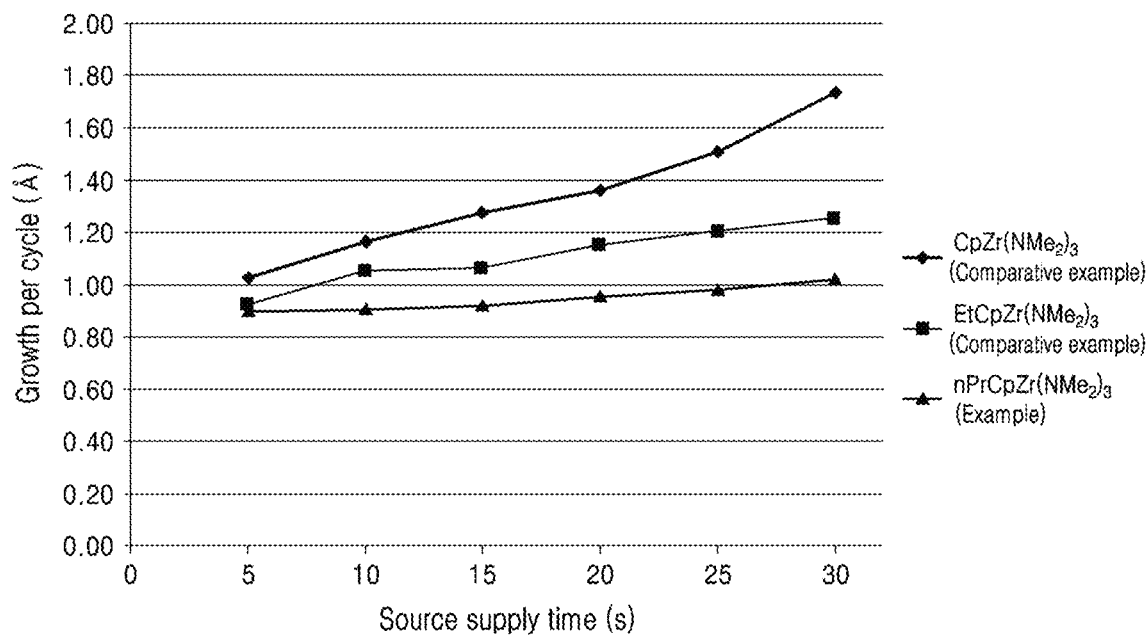
FIG. 4 shows the film growth by atomic layer deposition using Compound 1 [$^{n}$PrCpZr(NMe$_2$)$_3$] prepared according to an example of the present disclosure and the film growth of compounds prepared according to comparative examples, depending on the supply time of a precursor.

The substrate temperature was maintained at 300° C., and an ALD source material supply cycle in which after a gas of Compound 1 ["PrCpZr(NMe$_2$)$_3$] prepared according to Example 1 was supplied for 5 seconds, 10 seconds, 15 seconds, 20 seconds, 25 seconds, and 30 seconds, an argon gas was supplied for 10 seconds and then, an ozone ($O_3$) gas was supplied for 20 seconds and an argon gas was supplied again for 10 seconds was repeated 100 times. The film growth per source material supply cycle of the zirconium oxide thin film formed according to the above-described process was as shown in FIG. 4. As shown in FIG. 4, it can be seen that the film growth per ALD source material supply cycle was maintained relatively uniform as the time for supplying the gas of Compound 1 prepared according to Example 1 increased from 5 seconds to 30 seconds at a substrate temperature of 300° C. When the time for supplying a Group 4 metal precursor gas increases in the ALD source material supply cycle, the uniform film growth is more advantageous in uniformly forming a Group 4 metal element-containing film on the entire surfaces of a substrate having a fine trench (groove).

Figure 5:
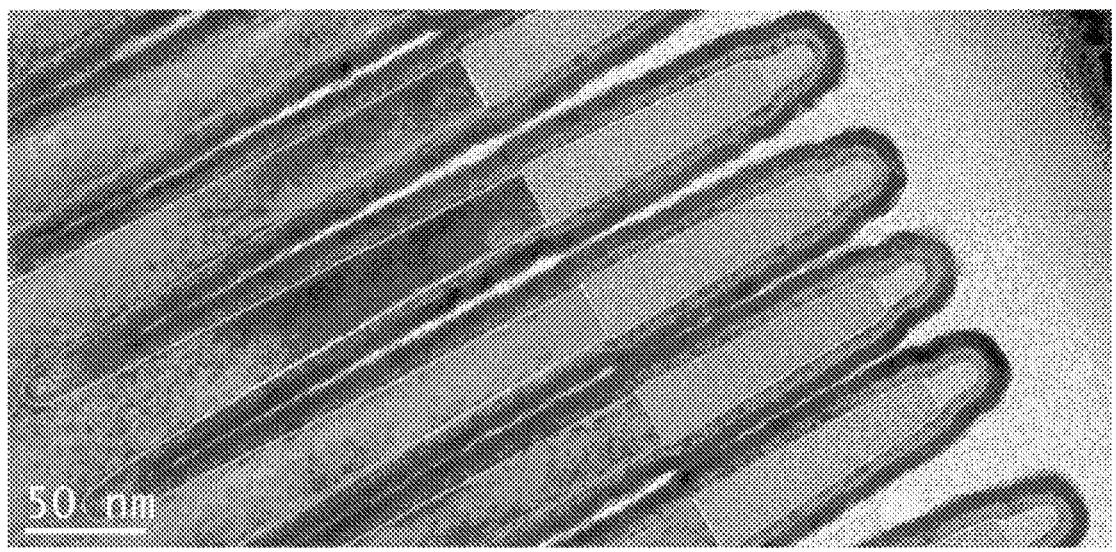
FIG. 5 shows a transmission electron microscope (TEM) observation result of a cross section of a film formed using Compound 1 [$^{n}$PrCpZr(NMe$_2$)$_3$] prepared according to an example of the present disclosure on a substrate including a narrow trench (groove).

FIG. 5 shows a transmission electron microscope (TEM) observation result of a cross section of a film formed by heating a substrate including a very narrow groove with an aspect ratio of 10:1 at 300° C. and repeating the above-described ALD source material supply cycle 80 times. It can be seen that a film having a uniform thickness of about 7 nm was formed on the entire surfaces of the substrate including a surface of the deepest portion of the trench in the substrate and an upper surface of the trench.

<Example 4> Formation of Zirconium Oxide Film by ALD Using Compound 2 and Ozone ($O_3$) Gas A test for forming a zirconium oxide film on a silicon substrate by atomic layer deposition (ALD) using Compound 2 ["BuCpZr(NMe$_2$)$_3$] prepared according to Example 2 was conducted. The same ALD reactor as used in Example 3 was used. The substrate was heated at 290° C. to 350° C. Further, the precursor Compound 2 put in a stainless-steel container was heated at a temperature of 110° C., and the precursor compound was supplied into the ALD reactor for performing atomic layer deposition by allowing an argon (Ar) gas to pass through the container at a flow velocity of 60 sccm. An internal pressure in the ALD reactor was maintained at 3 torr. An ALD source material supply cycle in which after a gas of the precursor Compound 2 was supplied into the ALD reactor for 5 seconds, an argon gas was supplied for 5 seconds and then, an ozone ($O_3$) gas was supplied for 5 seconds and an argon gas was supplied again for 5 seconds was repeated 200 times. The film growth per source material supply cycle of the zirconium oxide thin film formed according to the above-described process was as shown in FIG. 3. As shown in FIG. 3, it can be seen that the film growth per ALD source material supply cycle was uniform at a substrate temperature in the range of from 290° C. to 350° C.

Figure 6:
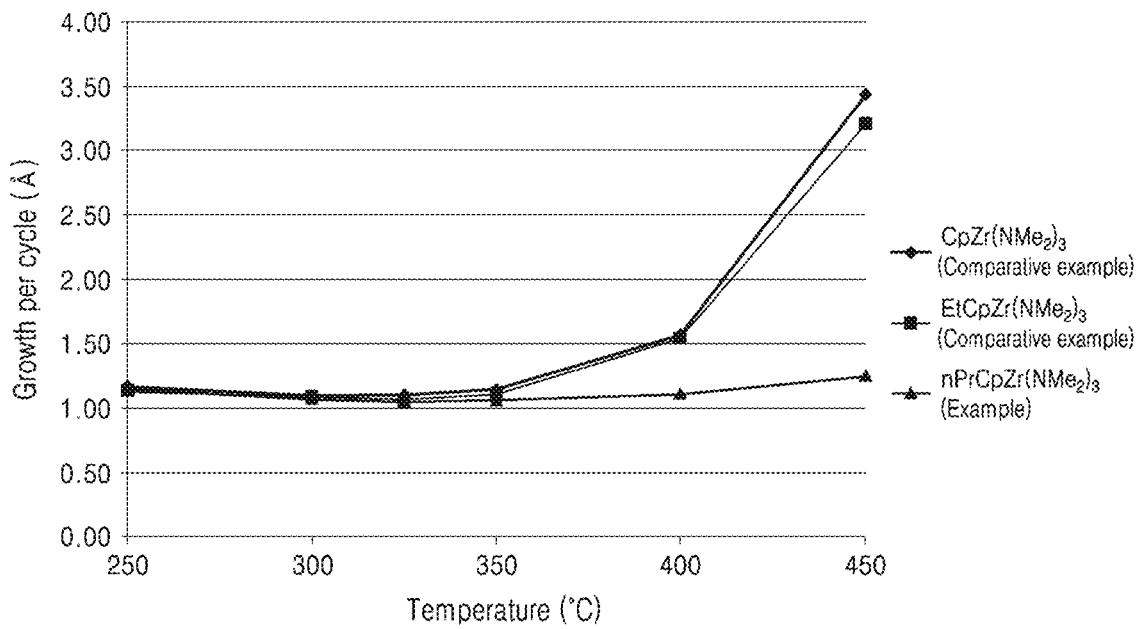
FIG. 6 shows the film growth by plasma atomic layer deposition using Compound 1 [$^{n}$PrCpZr(NMe$_2$)$_3$] prepared according to an example of the present disclosure and the film growth of compounds prepared according to comparative examples, depending on the substrate temperature.

<Example 5> Formation of Zirconium Oxide Film by ALD Using Compound 1 and Oxygen ($O_2$) Gas Plasma A test for forming a zirconium oxide film by plasma enhanced atomic layer deposition (PEALD) using Compound 1 ["PrCpZr(NMe$_2$)$_3$] put in a stainless-steel container as a precursor was conducted. A PEALD reactor in which a supplied gas is supplied in a direction perpendicular to the surface of a substrate through a shower head was used. $O_2$ gas plasma was generated by intermittently applying radio frequency (RF) power between the shower head and a heater on which a substrate is placed. In this case, the substrate was heated at a temperature of 250° C., 300° C., 350° C., 400° C. and 450° C. Further, a precursor compound put in the stainless-steel container was heated at a temperature of 110° C., and the precursor Compound 1 was supplied into the ALD reactor for performing atomic layer deposition by allowing an argon (Ar) gas to pass through the container at a flow velocity of 60 sccm. An internal pressure in the ALD reactor was maintained at 3 torr. A PEALD source material supply cycle in which after a gas of the precursor Compound 1 was supplied into the ALD reactor for 15 seconds, an argon gas was supplied for 10 seconds and then, an ozone (O₃) gas was supplied for 20 seconds while radio frequency (RF) power was applied to generate plasma within an ALD chamber in which the substrate was placed and an argon gas was supplied again for 10 seconds was repeated 100 times. The film growth per source material supply cycle of the zirconium oxide thin film formed according to the above-described process was as shown in FIG. 6. As shown in FIG. 6, it can be seen that the film growth per ALD source material supply cycle did not increase very much even when the substrate was heated to 450° C., which shows that Compound 1 [ⁿPrCpZr(NMe₂)₃] prepared according to Example 1 is more advantageous in forming a zirconium oxide film having a uniform thickness at a high substrate temperature than a Zr compound prepared according to Comparative Example.

<Comparative Example 1> Formation of Zirconium Oxide Film by ALD Using CpZr[N(CH₃)₂]₃ and EtCpZr[N(CH₃)₂]₃ and Ozone (O₃) Gas A zirconium oxide film was formed in the same conditions as in Example 3 except that CpZr[N(CH₃)₂]₃ and EtCpZr[N(CH₃)₂]₃ put in a stainless-steel container were heated at a temperature of 90° C. and EtCpZr[N(CH₃)₂]₃ was heated at a temperature of 105° C. The same ALD reactor as used in Example 3 was used. A substrate temperature was maintained at 300° C., and an ALD source material supply cycle in which after a gas of CpZr[N(CH₃)₂]₃ or EtCpZr[N(CH₃)₂]₃ was supplied for 5 seconds, 10 seconds, 15 seconds, 20 seconds, 25 seconds, and 30 seconds, an argon gas was supplied for 10 seconds and then, an ozone (O₃) gas was supplied for 20 seconds and an argon gas was supplied again for 10 seconds was repeated 100 times. The film growth per source material supply cycle of the zirconium oxide thin film formed according to the above-described process was as shown in FIG. 4. As shown in FIG. 4, it can be seen that the film growth per ALD source material supply cycle increased as the time for supplying the gas of CpZr[N(CH₃)₂]₃ or EtCpZr[N(CH₃)₂]₃ increased from 5 seconds to 30 seconds. When the time for supplying a Group 4 metal precursor gas increases in the ALD source material supply cycle, if the film growth increases, an upper surface of a substrate on the surface of a fine trench (groove) shows a greater film growth than the deepest portion of the groove, which is disadvantageous in uniformly forming a Group 4 metal element-containing film on the entire surface of the substrate having a trench (groove).

<Comparative Example 2> Formation of Zirconium Oxide Film by ALD Using CpZr[N(CH₃)₂]₃ and EtCpZr[N(CH₃)₂]₃ and Oxygen (O₂) Plasma A zirconium oxide film was formed in the same conditions as in Example 5 except that CpZr[N(CH₃)₂]₃ put in a stainless-steel container was heated at a temperature of 90° C. and EtCpZr[N(CH₃)₂]₃ was heated at a temperature of 105° C. The same PEALD reactor as used in Example 5 was used. The film growth per source material supply cycle of the zirconium oxide thin film formed according to the above-described process was as shown in FIG. 6. As shown in FIG. 6, it can be seen that CpZr[N(CH₃)₂]₃ and EtCpZr[N(CH₃)₂]₃ greatly increased in film growth at a substrate temperature of 400° C. and 450° C., which shows that it is difficult to form a zirconium oxide film having a uniform thickness at these temperatures by plasma enhanced atomic layer deposition using CpZr[N(CH₃)₂]₃ and EtCpZr[N (CH₃)₂]₃. Referring to a comparison between Comparative Example 2 and Example 5, it can be seen that Compound 1 [ⁿPrCpZr(NMe₂)₃] prepared according to Example 1 is more advantageous in forming a zirconium oxide film having a uniform thickness at a high substrate temperature than CpZr[N(CH₃)₂]₃ and EtCpZr[N(CH₃)₂]₃.

It can be seen from Examples 3, 4 and 5 and Comparative Examples 1 and 2 that atomic layer deposition using a novel Zr compound of the present disclosure is more advantageous in forming a zirconium oxide film to a uniform thickness on the entire surfaces of a substrate having a groove (trench) and including a surface of the deepest portion of the groove and an upper surface of the groove at a higher temperature than atomic layer deposition using gases of CpZr[N(CH₃)₂]₃ and EtCpZr[N(CH₃)₂]₃ conventionally known in the art.

The reason why ⁿPrCpZr(NMe₂)₃ prepared according to example of the present disclosure can undergo ALD at a much higher temperature is that —CH₂CH₂CH₃ at a terminal of an ⁿPrCp group can react with zirconium metal and can be stably bonded to the surface of the substrate as shown below:

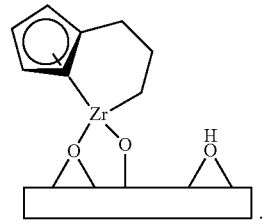

CpZr[N(CH₃)₂]₃ used in Comparative Example does not have a terminal which can be bonded as such, and as for EtCpZr[N(CH₃)₂]₃, —CH₂CH₃ at a terminal of an EtCp group is too short to be bonded to a Zr metal. Therefore, more desirably, R¹Cp of (R¹C₅H₄)MA₃ prepared according to the embodiments and Examples of the present disclosure may be in the form of Cp linked to three carbon atoms in a chain (except $^{iso}$PrCp and $^{tert}$BuCp).

<Example 6> Preparation of ⁿPrCpZr(NEt₂)₃ and ⁿPrCpZr(NEtMe)₃

A precursor material ⁿPrCpZr(NEt₂)₃ or ⁿPrCpZr(NEtMe)₃ was prepared in the same manner as in Example 1 except tetrakis(diethylamino)zirconium [Zr(NEt₂)₄] or tetrakis(ethylmethylamino)zirconium [Zr(NEtMe)₄] was used instead of tetrakis(dimethylamino)zirconium [Zr(NMe₂)₄] used in Example 1.

<Example 7> Preparation of ⁿPrCpHf(NMe₂)₃

After tetrakis(ethylmethylamino)hafnium [Hf(N(CH₃)₂)₄] and n-hexane were put into a flame-dried 1 L Schlenk flask, the room temperature was maintained. After n-propyl cyclopentadiene was slowly dropwise added into the flask, the reaction solution was stirred for 3 hours at room temperature.

After the reaction was completed, the solvent was removed under depressurized conditions, followed by distillation under depressurized conditions to obtain a pale yellow liquid compound represented by ⁿPrCpHf(NMe₂)₃.

Boiling point (bp): 100° C. (0.3 torr);

1H-NMR (400 MHz, C₆D₆, 25° C.): δ 5.985, 5.901 (m, 4H, C₅H₄—CH₂CH₂CH₃), δ 2.991 (s, 18H, N(CH₃)₂), δ

2.489 (t, 2H, C$_5$H$_4$—C$\underline{H}_2$CH$_2$CH$_3$), δ 1.545 (m, 2H, C$_5$H$_4$—CH$_2$C$\underline{H}_2$CH$_3$), δ 0.908 (t, 3H, C$_5$H$_4$—CH$_2$CH$_2$C$\underline{H}_3$).

<Example 8> Preparation of "PrCpTi(NMe$_2$)$_3$

After tetrakis(ethylmethylamino)titanium [Ti(N(CH$_3$)$_2$)$_4$] and n-hexane were put into a flame-dried 1 L Schlenk flask, the room temperature was maintained. After n-propyl cyclopentadiene was slowly dropwise added into the flask, the reaction solution was stirred for 3 hours at room temperature.

After the reaction was completed, the solvent was removed under depressurized conditions, followed by distillation under depressurized conditions to obtain a pale yellow liquid compound represented by "PrCpTi(NMe$_2$)$_3$.

<Example 9> Preparation of "PrCpTi(OMe)$_3$

After "PrCpTi(NMe$_2$)$_3$ prepared according to example 8 and n-hexane were put into a flame-dried 250 mL Schlenk flask, methanol was slowly dropwise added into the flask, followed by stirring for 2 hours at room temperature.

After the reaction was completed, the solvent and volatile by-products were removed under depressurized conditions, followed by distillation under depressurized conditions to obtain a pale yellow liquid compound represented by "PrCpTi(OMe)$_3$.

Boiling point (bp): 80° C. (0.25 torr);
1H-NMR (400 MHz, C$_6$D$_6$, 25): δ 5.989, 5.956 (m, 4H, C$_5$$\underline{H}_4$—CH$_2$CH$_2$CH$_3$), δ 4.045 (s, 6H, OC$\underline{H}_3$), δ 2.520 (t, 2H, C$_5$H$_4$—C$\underline{H}_2$CH$_2$CH$_3$), δ 1.566 (m, 2H, C$_5$H$_4$—CH$_2$C$\underline{H}_2$CH$_3$), δ 0.887 (t, 3H, C$_5$H$_4$—CH$_2$CH$_2$C$\underline{H}_3$).

Figure 7:
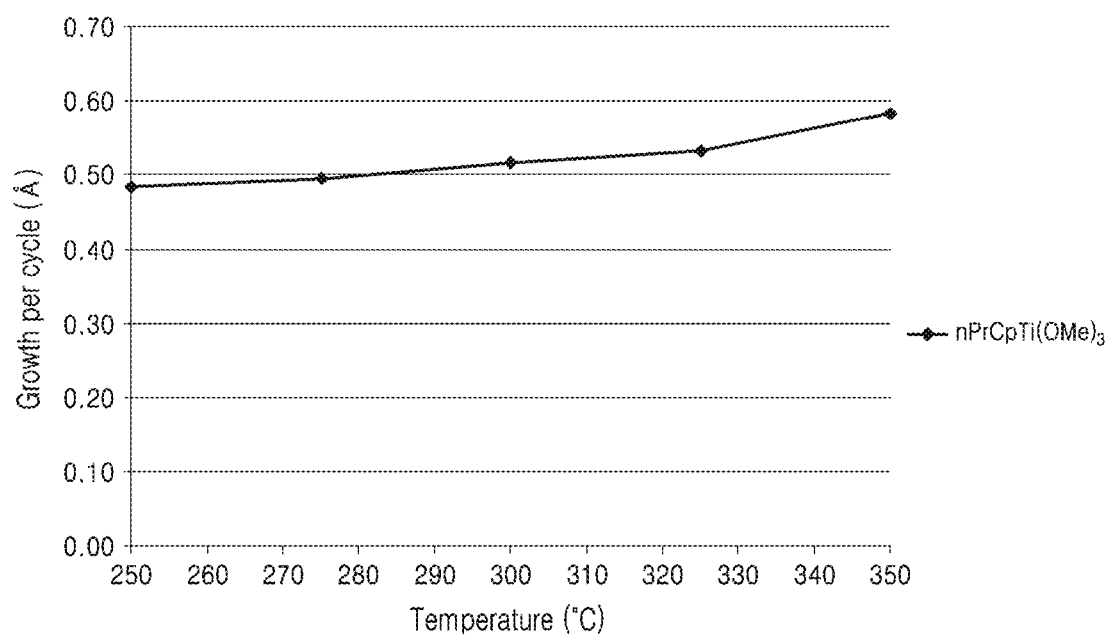
FIG. 7 shows the film growth by atomic layer deposition using $^{n}$PrCpTi(OMe)$_3$ prepared according to an example of the present disclosure, depending on the substrate temperature.

<Example 10> Formation of Titanium Oxide Film by ALD Using "PrCpTi(OMe)$_3$ and Ozone (O$_3$) Gas A test for forming a titanium oxide film by atomic layer deposition (ALD) using "PrCpTi(OMe)$_3$ prepared according to Example 9 as a precursor and an ozone (O$_3$) gas as a reaction gas was conducted. In this case, a silicon (Si) wafer was used as a substrate. The substrate was heated in the range of from 250° C. to 350° C. Further, a precursor compound put in the stainless-steel container was heated at a temperature of 90° C., and the precursor compound was supplied into the ALD reactor for performing atomic layer deposition by allowing an argon (Ar) gas to pass through the container at a flow velocity of 60 sccm. An internal pressure in the ALD reactor was maintained at 3 torr. An ALD source material supply cycle in which after a gas of the precursor compound was supplied into the ALD reactor for 10 seconds, an argon gas was supplied for 10 seconds and then, an ozone (O$_3$) gas was supplied for 10 seconds and an argon gas was supplied again for 10 seconds was repeated 200 times. The film growth per source material supply cycle of the titanium oxide thin film formed according to the above-described process was as shown in FIG. 7. As shown in FIG. 7, it can be seen that the film growth per ALD source material supply cycle was approximately constant to 0.05 nm/cycle at a substrate temperature in the range of from 250° C. to 350° C.

The above description of the present disclosure is provided for the purpose of illustration, and it would be understood by a person with ordinary skill in the art that various changes and modifications may be made without changing technical conception and essential features of the present disclosure. Thus, it is clear that the above-described examples are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

What is claimed is:

1. A method of forming a zirconium containing film, comprising:
reacting a precursor containing a zirconium containing compound represented by the following Chemical Formula I with a reaction gas to form the zirconium containing film on a substrate, $$(R^1C_5H_4)MA_3; \quad \text{[Chemical Formula I]}$$

wherein, in the above Chemical Formula I,
M is Zr,
R$^1$ is n-propyl group or n-butyl group,
A is —NR$^2$R$^3$, and
each of R$^2$ and R$^3$ is independently methyl or ethyl, and
wherein the zirconium-containing film is formed on the substrate comprising a trench with an aspect ratio of 10:1 or more and a width of 1 μm or less.

2. The method of claim 1,
Wherein the zirconium containing film is formed on the substrate by vapor deposition.

3. The method of claim 1,
wherein the zirconium containing film is a zirconium containing oxide film, nitride film, oxynitride film, carbide film or carbonitride film.

4. The method of claim 1, further comprising:
providing at least one surfaces of the substrate in a reaction chamber;
introducing the precursor containing the zirconium containing compound into the reaction chamber; and
introducing the reaction gas into the reaction chamber,
wherein the zirconium containing film is formed on the at least one surfaces of the substrate by vapor deposition.

5. The method of claim 1,
wherein the reaction gas includes at least one selected from the group consisting of an oxygen-containing source, a nitrogen-containing source, a carbon-containing source, and a reducing agent.

6. The method of claim 1,
simultaneously or sequentially supplying at least one additional precursor containing a metal element that is identical to or different from that of a first precursor containing the zirconium containing compound and the first precursor to form a film containing the zirconium element and at least one additional metal element.

7. The method of claim 1,
wherein the vapor deposition includes at least one selected from the group consisting of chemical vapor deposition, low pressure chemical vapor deposition, plasma enhanced chemical vapor deposition, cyclic chemical vapor deposition, plasma enhanced cyclic chemical vapor deposition, atomic layer deposition, and plasma enhanced atomic layer deposition.

8. The method of claim 1,
wherein the zirconium-containing film is formed on the substrate for a DRAM semiconductor device.

\* \* \* \* \*